(12) United States Patent
Doris et al.

(10) Patent No.: US 9,349,798 B1
(45) Date of Patent: May 24, 2016

(54) CMOS STRUCTURES WITH SELECTIVE TENSILE STRAINED NFET FINS AND RELAXED PFET FINS

(71) Applicant: International Business Machines Corporation, Armonk, NY (US)

(72) Inventors: Bruce B. Doris, Slingerlands, NY (US); Hong He, Schenectady, NY (US); Ali Khakifirooz, Los Altos, CA (US); Joshua M. Rubin, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/753,386

(22) Filed: Jun. 29, 2015

(51) Int. Cl.
| | |
|---|---|
| *H01L 21/84* | (2006.01) |
| *H01L 27/12* | (2006.01) |
| *H01L 29/10* | (2006.01) |
| *H01L 27/092* | (2006.01) |
| *H01L 21/321* | (2006.01) |
| *H01L 29/66* | (2006.01) |
| *H01L 21/02* | (2006.01) |
| *H01L 21/311* | (2006.01) |

(52) U.S. Cl.
CPC ........ *H01L 29/1054* (2013.01); *H01L 21/0254* (2013.01); *H01L 21/02271* (2013.01); *H01L 21/31111* (2013.01); *H01L 21/32105* (2013.01); *H01L 27/0924* (2013.01); *H01L 29/66553* (2013.01); *H01L 29/66795* (2013.01)

(58) Field of Classification Search
CPC .............. H01L 21/76283; H01L 21/84; H01L 21/823807
USPC .............. 257/18, 55, 615, 622; 438/149, 175, 438/199, 218, 424, 478
See application file for complete search history.

(56) References Cited

U.S. PATENT DOCUMENTS

| | | |
|---|---|---|
| 6,309,942 B1 | 10/2001 | Tsui et al. |
| 6,974,981 B2 | 12/2005 | Chidambarrao et al. |
| 6,974,984 B2 | 12/2005 | Windlass et al. |
| 7,185,023 B2 | 2/2007 | Kothuri |
| 7,386,561 B1 | 6/2008 | Ramesh et al. |
| 7,388,259 B2 | 6/2008 | Doris et al. |
| 7,476,580 B2 | 1/2009 | Zhu et al. |
| 8,183,627 B2 | 5/2012 | Currie |
| 8,264,021 B2 | 9/2012 | Lai et al. |
| 8,623,728 B2 | 1/2014 | Chang et al. |

(Continued)

OTHER PUBLICATIONS

A. Fargeix et al., "Dry oxidation of silicon: A new model of growth including relaxation of stress by viscous flow," Journal of Applied Physics, vol. 54, No. 12, Dec. 1983, pp. 7153-7158.

(Continued)

*Primary Examiner* — Evan Pert
*Assistant Examiner* — Changhyun Yi
(74) *Attorney, Agent, or Firm* — Cantor Colburn LLP; Vazken Alexanian

(57) ABSTRACT

A method of forming CMOS structures with selective tensile strained NFET fins and relaxed PFET fins includes performing a first, partial fin etch on a tensile strained silicon layer of a semiconductor substrate; selectively oxidizing bottom surfaces of the tensile strained silicon layer in a PFET region of the semiconductor substrate, thereby causing PFET silicon fins defined in the PFET region to become relaxed; and performing a second fin etch to define NFET silicon fins in an NFET region of the semiconductor substrate, wherein the NFET silicon fins remain tensile strained.

3 Claims, 12 Drawing Sheets

(56) References Cited

U.S. PATENT DOCUMENTS

| | | | |
|---|---|---|---|
| 9,165,945 B1* | 10/2015 | Sadaka | ............ H01L 27/1211 |
| 2006/0155679 A1 | 7/2006 | Kothuri et al. | |
| 2014/0151802 A1 | 6/2014 | Basker et al. | |
| 2014/0349460 A1 | 11/2014 | Vinet et al. | |

OTHER PUBLICATIONS

Y.-C. Yeo, "Advanced channel and contact technologies for future CMOS devices," IEEE International Symposium on VLSI Technology, Systems, and Applications (VLSI-TSA), 2012, pp. 1-2.

* cited by examiner

US 9,349,798 B1

CMOS STRUCTURES WITH SELECTIVE TENSILE STRAINED NFET FINS AND RELAXED PFET FINS

BACKGROUND

The present invention relates generally to semiconductor device manufacturing and, more particularly, to forming CMOS structures with selective tensile strained NFET fins and relaxed PFET fins.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type transistors (NFET and PFET) are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. One of the more important indicators of potential device performance is the carrier mobility. There is a significant challenge with respect to keeping carrier mobility high in devices of deeply submicron generations.

The gain of an FET, usually defined by the transconductance ($g_m$), is proportional to the mobility ($\mu$) of the majority carrier in the transistor channel. The current carrying capability, and hence the performance of an FET is proportional to the mobility of the majority carrier in the channel. The mobility of holes, which are the majority carriers in a PFET, and the mobility of electrons, which are the majority carriers in an NFET transistor, may be enhanced by applying an appropriate stress to the channel. Existing stress engineering methods greatly enhance circuit performance by increasing device drive current without increasing device size and device capacitance. For example, a tensile stress liner applied to an NFET transistor induces a longitudinal stress in the channel and enhances the electron mobility, while a compressive stress liner applied to a PFET transistor induces a compressive stress in the channel and enhances the hole mobility.

SUMMARY

In one aspect, a method of forming CMOS structures with selective tensile strained NFET fins and relaxed PFET fins includes performing a first, partial fin etch on a tensile strained silicon layer of a semiconductor substrate; selectively oxidizing bottom surfaces of the tensile strained silicon layer in a PFET region of the semiconductor substrate, thereby causing PFET silicon fins defined in the PFET region to become relaxed; and performing a second fin etch to define NFET silicon fins in an NFET region of the semiconductor substrate, wherein the NFET silicon fins remain tensile strained.

In another aspect, a method of forming CMOS structures with selective tensile strained NFET fins and relaxed PFET fins includes forming a hardmask layer on a tensile strained silicon layer of a strained silicon on insulator (SSOI) substrate; patterning the hardmask layer to define fin patterns; performing a first, partial fin etch of the tensile strained silicon layer; forming a dielectric spacer layer over the partially etched tensile strained silicon layer; patterning a block mask to protect an NFET region of the SSOI substrate; anisotropically etching horizontal surfaces of the dielectric spacer layer in a PFET region to form sidewall spacers; oxidizing bottom surfaces of the tensile strained silicon layer in the PFET region of the semiconductor substrate, thereby causing PFET silicon fins defined in the PFET region to become relaxed; and performing a second fin etch to define NFET silicon fins in the NFET region of the semiconductor substrate, wherein the NFET silicon fins remain tensile strained.

In another aspect, a CMOS structure includes a semiconductor substrate; a plurality of NFET fins formed on the substrate, the plurality of NFET fins comprising a tensile strained silicon material; and a plurality of PFET fins formed on the substrate, the plurality of PFET fins comprising relaxed silicon material; wherein bottom portions of the PFET fins comprised oxidized portions of the initially tensile strained silicon material such that the oxidized portions cause relaxation of the initially tensile strained silicon material.

BRIEF DESCRIPTION OF THE DRAWINGS

Referring to the exemplary drawings wherein like elements are numbered alike in the several Figures:

FIGS. 1 through 11 are a series of cross sectional views of an exemplary embodiment of a method of forming CMOS structures with selective tensile strained NFET fins and relaxed PFET fins, in accordance with an exemplary embodiment, in which:

FIG. 1 illustrates an exemplary starting wafer including a strained silicon on insulator (SSOI) substrate, having a bulk layer, a buried oxide layer on the bulk layer, and an SSOI layer bonded to the BOX layer;

FIG. 2 illustrates a hardmask layer formed over the SSOI layer in preparation of an initial fin etching step to define both NFET fins and PFET fins within the tensile SSOI layer;

FIG. 3 illustrates patterning of the hardmask layer;

FIG. 4 illustrates a first, partial etch process to define the NFET and PFET fin structures in the tensile SSOI layer;

FIG. 5 illustrates a dielectric spacer layer conformally deposited over the partially defined fin structures in the SSOI layer, as well as the patterned hardmask layer;

FIG. 6 illustrates a block mask layer formed over the structure of FIG. 5;

FIG. 7 illustrates patterning the block mask layer to define an NFET region and a PFET region;

FIG. 8 illustrates an anisotropic etch to remove horizontally disposed portions of the dielectric spacer layer in the PFET region;

FIG. 9 illustrates the removal of the remaining block mask layer from the NFET region;

FIG. 10 illustrates an oxidation process to convert the exposed bottom surface of the partially etched strained silicon layer to an oxide material layer, which relaxes the tensile strain in the partially etched silicon fins in the PFET region;

FIG. 11 illustrates oxide removal of at least a portion of the oxide material layer not directly under the relaxed silicon PFET fins, and a nitride removal process to remove remaining portions of the dielectric spacer layer/sidewall spacers, and original hardmask layer.

DETAILED DESCRIPTION

Figure 1:
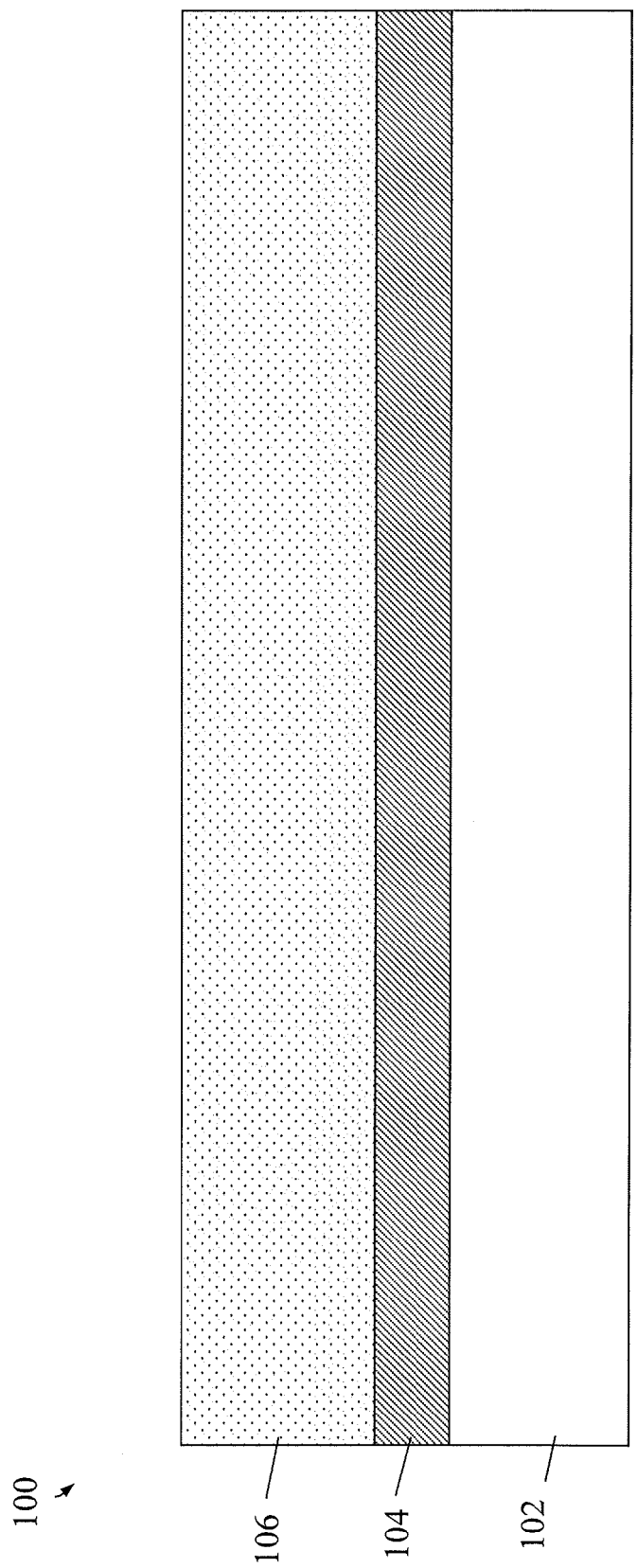

As transistor device pitch is scaled, conventional strain engineering techniques such as embedded stressors and stress liners (discussed above) lose their effectiveness. Strained substrates, such strained Si on insulator (SSOI) and strained SiGe on insulator are also promising methods as the strain is built into the channel and is thus independent of the device pitch. On the one hand, while use of a strained SOI device layer to improve NFET performance has been demonstrated, the same tensile strained silicon actually degrades PFET performance. Ideally, then, it would be desirable to be able to provide a single semiconductor device layer that provides (for example) tensile strained silicon fins in first regions where NFET devices are to be formed, and that also provides relaxed silicon fins (that can optionally be converted later into compressively strained SiGe) in second regions where PFET devices are to be formed.

Accordingly, disclosed herein is a method of forming CMOS structures with selective tensile strained NFET fins and relaxed PFET fins. By initially performing a partial fin etch on a tensile strained silicon layer, selectively forming sidewall spacers on the partially etched fins of a PFET region, and then oxidizing bottom surfaces of the silicon layer, the silicon fins in PFET regions become relaxed. Thereafter, the spacer material is removed and the etch completed so as to define tensile strained NFET fins and relaxed PFET fins. Optionally, a further process can be used to perform a silicon germanium (SiGe) cladding on the PFET fins followed by condensation to convert the relaxed silicon PFET fins into compressively strained PFET fins.

Referring generally now to FIGS. 1 through 11, there is shown a series of cross sectional views of a method of forming CMOS structures with selective tensile strained NFET fins and relaxed PFET fins, in accordance with an exemplary embodiment. As particularly shown in FIG. 1, an exemplary starting wafer 100 is depicted as a strained silicon on insulator (SSOI) substrate, and includes a bulk layer 102 (e.g. silicon), a buried oxide (BOX) layer 104 on the bulk layer 102, and an SSOI layer 106 bonded to the BOX layer 104.

As is known in the art, SSOI wafers (like relaxed SOI wafers) are an engineered composite wafer substrate that chipmakers can use as the starting material for fabricating integrated circuits (ICs). It is the substrate of choice applications such as high-speed circuits, wireless and broadband communications. The SSOI fabrication process is designed to be as similar as possible to the method of fabricating conventional SOI wafers. Just like in SOI, a bond interface is usually placed near a handle wafer. Strained Si films, typically about 200 angstroms (Å) thick, are transferred directly to a new handle wafer, followed by removal of a residual SiGe layer by selective etching. The strained Si films are produced by epitaxially growing silicon over a quality layer of SiGe that has a uniform amount of SiGe throughout (i.e., enough germanium to get a lattice constant sufficient to stretch a final cap layer of silicon, but not enough to introduce large numbers of defects. If the SiGe template layer is fully relaxed, the cap layer of silicon grown thereon will then be optimally tensile strained.

Figure 2:
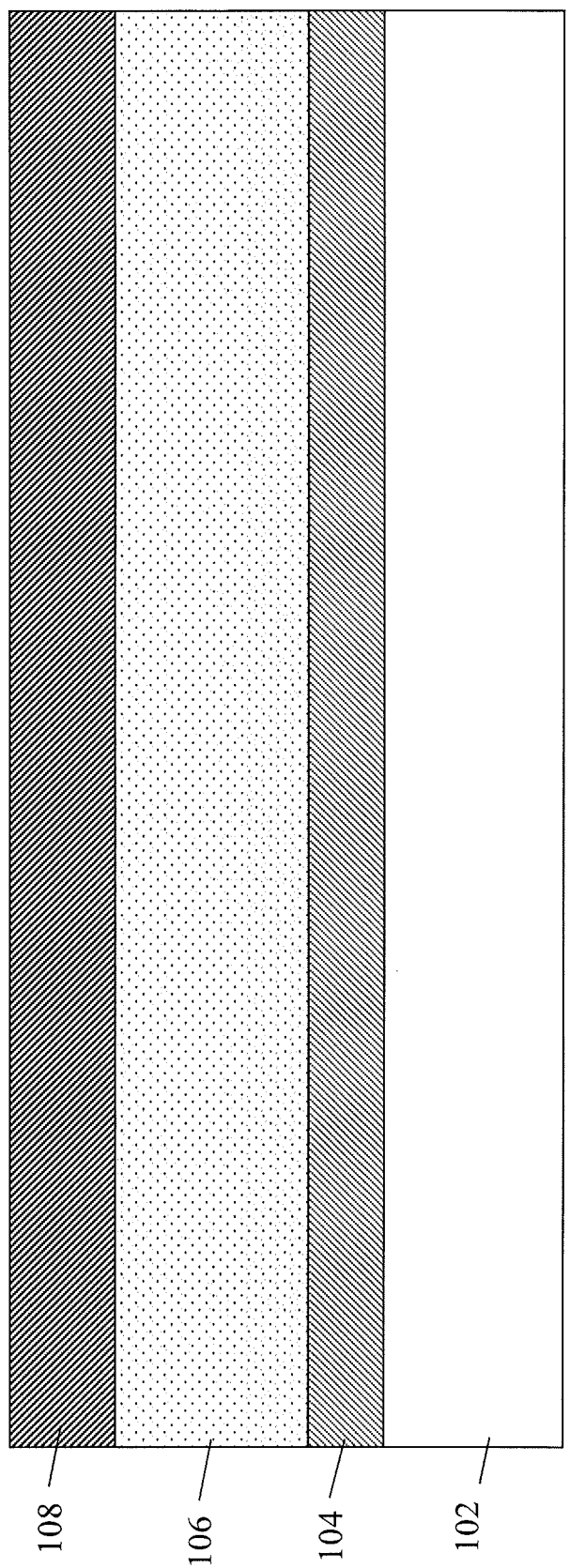
Figure 3:
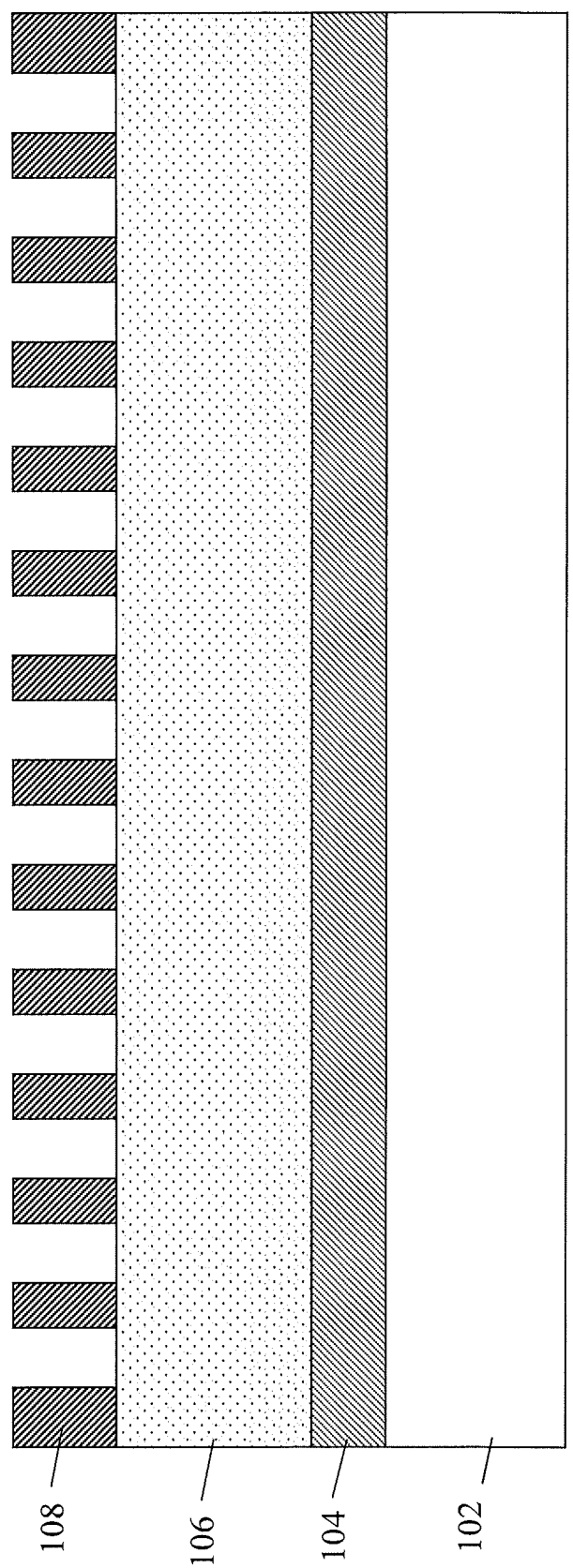

It will be appreciated that the starting SSOI substrate 100 with the tensile strained silicon layer 106 can be fabricated by any techniques known in the art. In addition, instead of an SSOI layer 106, the strained silicon may alternatively be formed on a strain relaxed buffer (SRB) layer. As shown in FIG. 2, a hardmask layer 108 (e.g., a nitride material) is formed over the SSOI layer 106 in preparation of an initial fin etching step to define both NFET fins and PFET fins within the tensile SSOI layer 106. Then, as shown in FIG. 3, the hardmask layer 108 is patterned in accordance with a suitable technique as known in the art such as, for example, sidewall image transfer (SIT).

Figure 4:
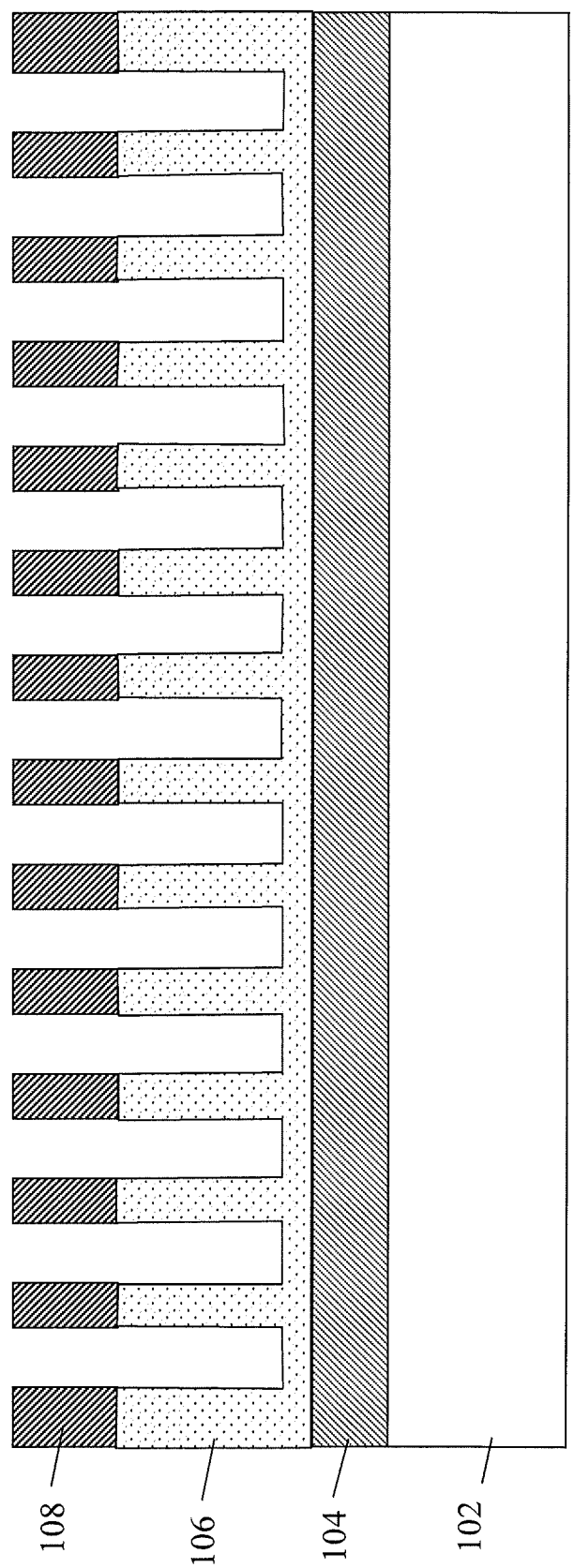

Using the patterned hardmask 108, a first fin etch process is performed in order to partially define the NFET and PFET fin structures in the tensile SSOI layer 106, as shown in FIG. 4. Since the first, partial fin etch is a timed etch that does not completely etch though SSOI layer 106, the BOX layer 104 is not used as an etch stop at this particular point in the process.

Figure 5:
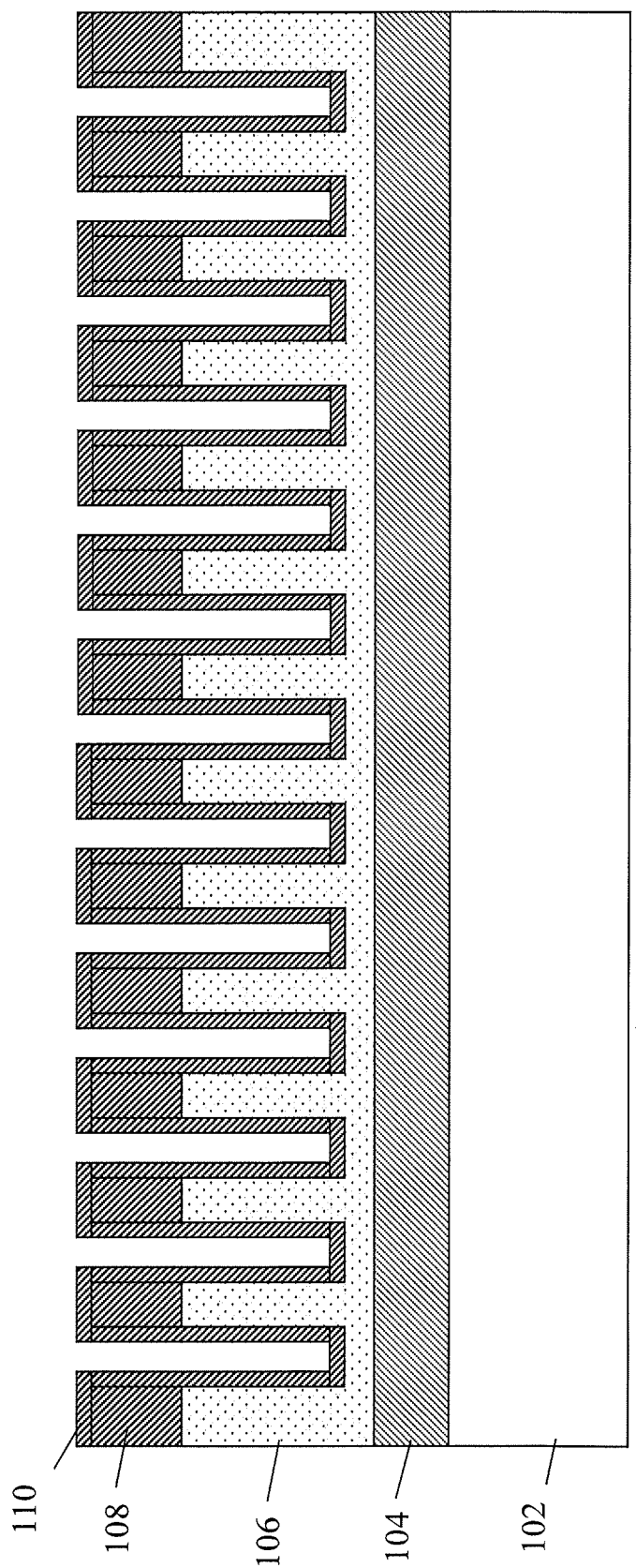
Figure 6:
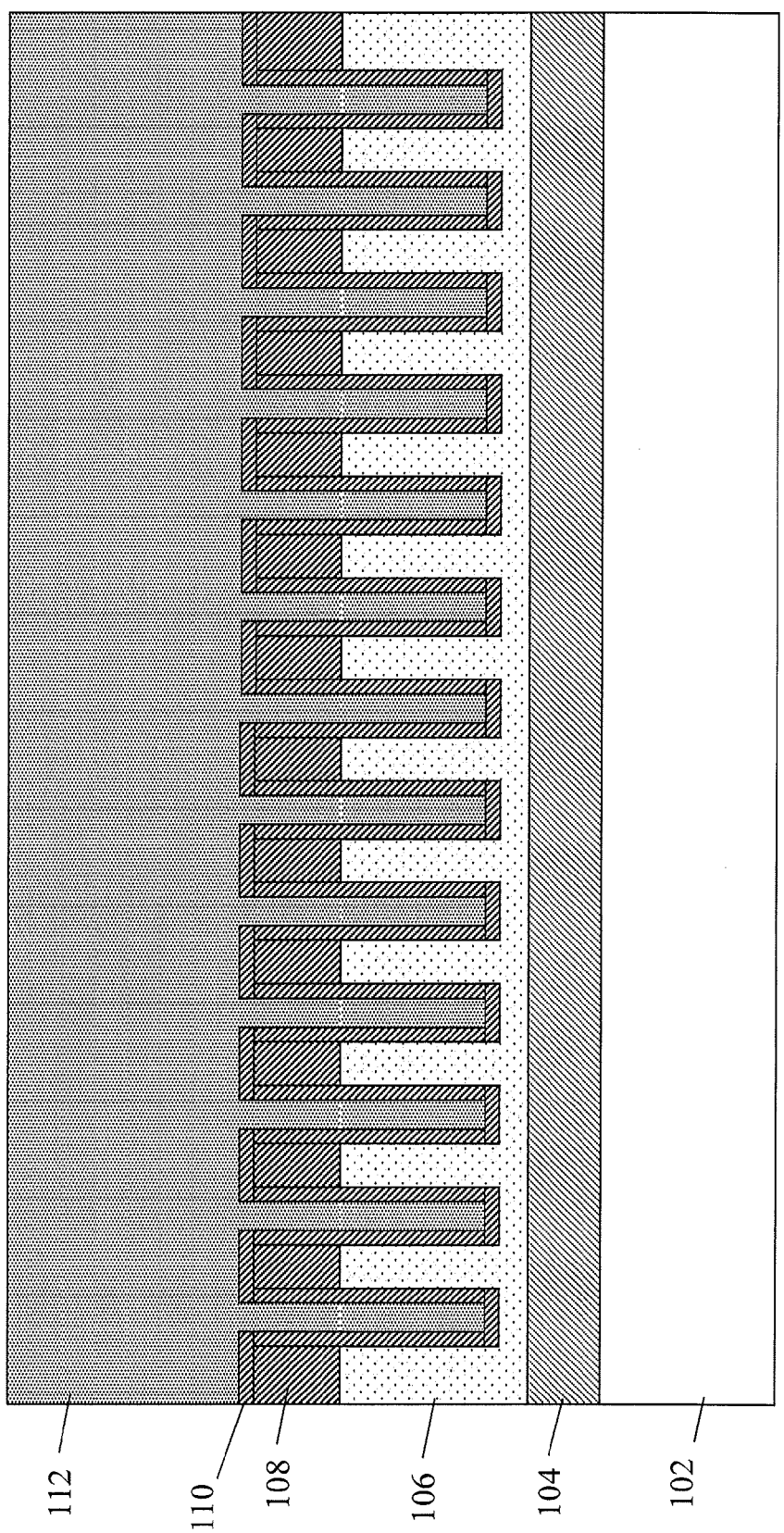
Figure 7:
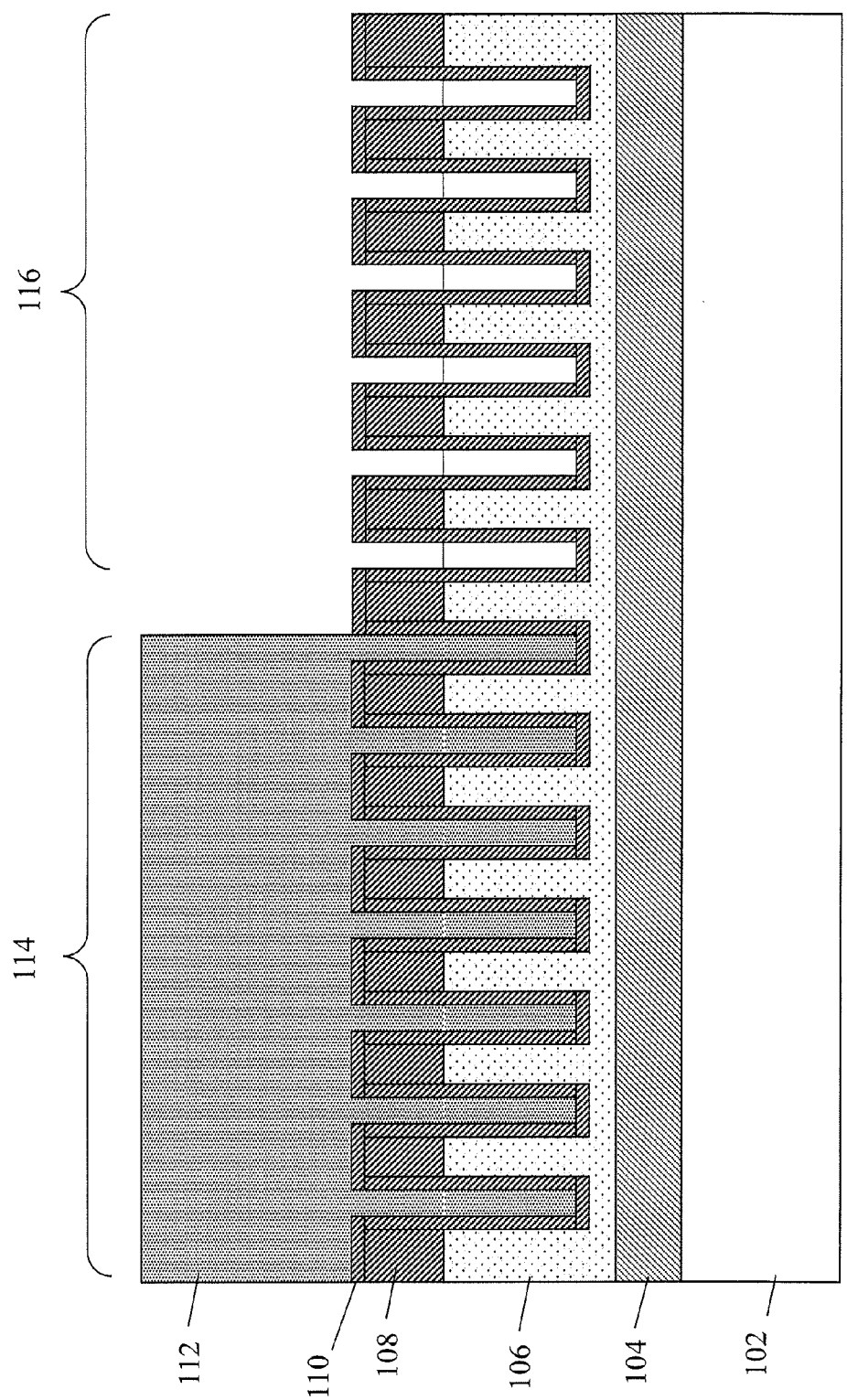

Referring now to FIG. 5, a dielectric spacer layer 110 is conformally deposited over the partially defined fin structures in the SSOI layer 106, as well as the patterned hardmask layer 108. The dielectric spacer layer 110 may also be a silicon nitride layer, for example. A block mask layer 112 is then formed over the structure, as shown in FIG. 6. The block mask layer 112 may be any suitable layer as known in the art, so as to have an etch selectivity with respect to the dielectric spacer layer 110. Then, as shown in FIG. 7, the block mask layer 112 is patterned so as to define an NFET region 114 and a PFET region 116. That is, NFET region 114 defines locations of tensile strained silicon fins, and PFET region 116 defines locations of relaxed silicon fins or, alternatively, compressive strained silicon germanium fins.

Figure 8:
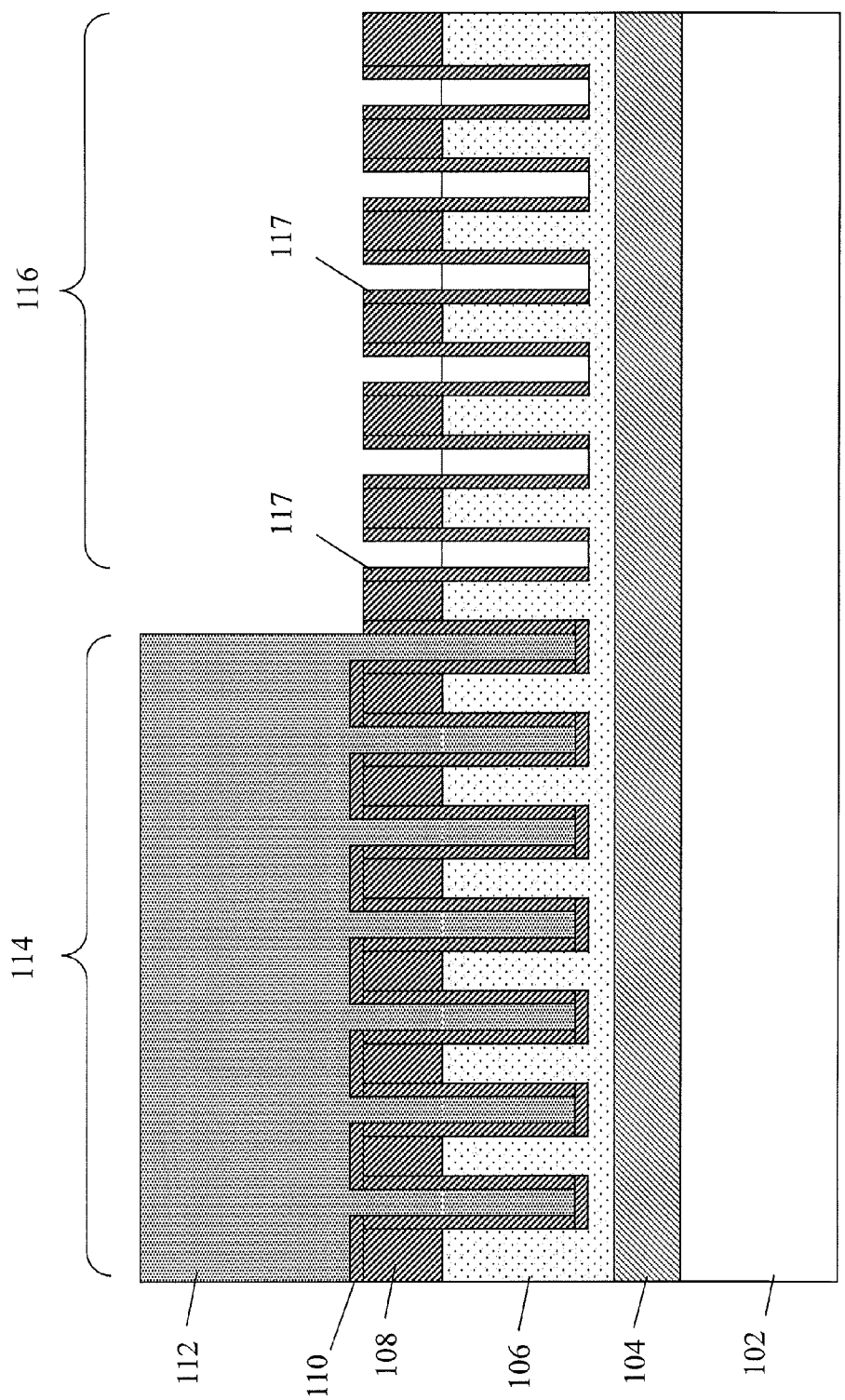
Figure 9:
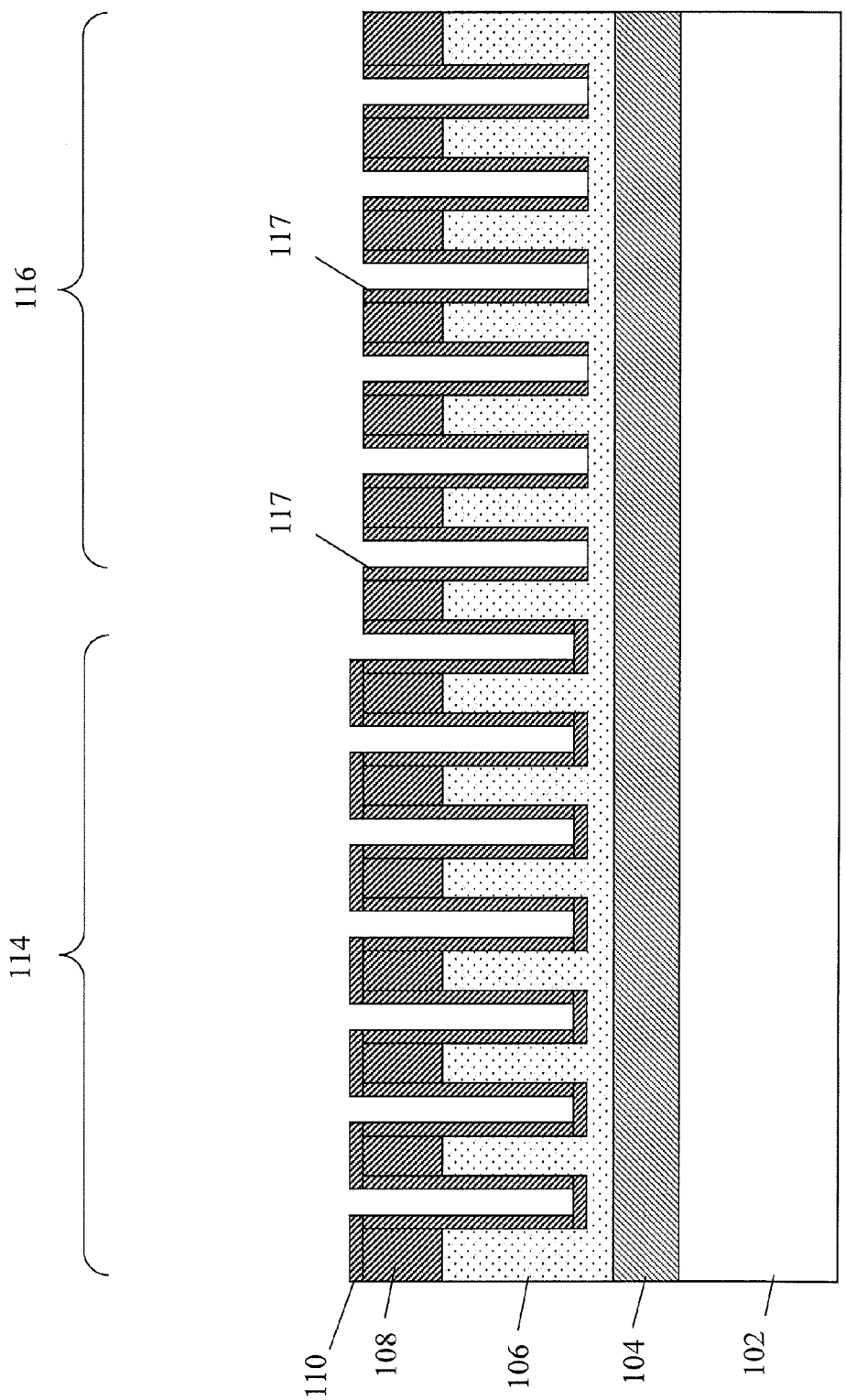

An anisotropic etch is then performed to remove horizontally disposed portions of the dielectric spacer layer 110 in the PFET region, as shown in FIG. 8. This etch results in the formation of sidewall spacers 117 that protect sidewall surfaces of the partially defined PFET regions fins, but still exposes the bottom surface of the partially etched strained silicon layer 106. In FIG. 9, the remaining block mask layer 112 is removed from the NFET region 114. Since the block mask layer 112 protected the dielectric spacer layer 110 in the NFET region 114, the bottom surface of the partially etched strained silicon layer 106 is still covered by the dielectric spacer layer 110 in this region.

Figure 10:
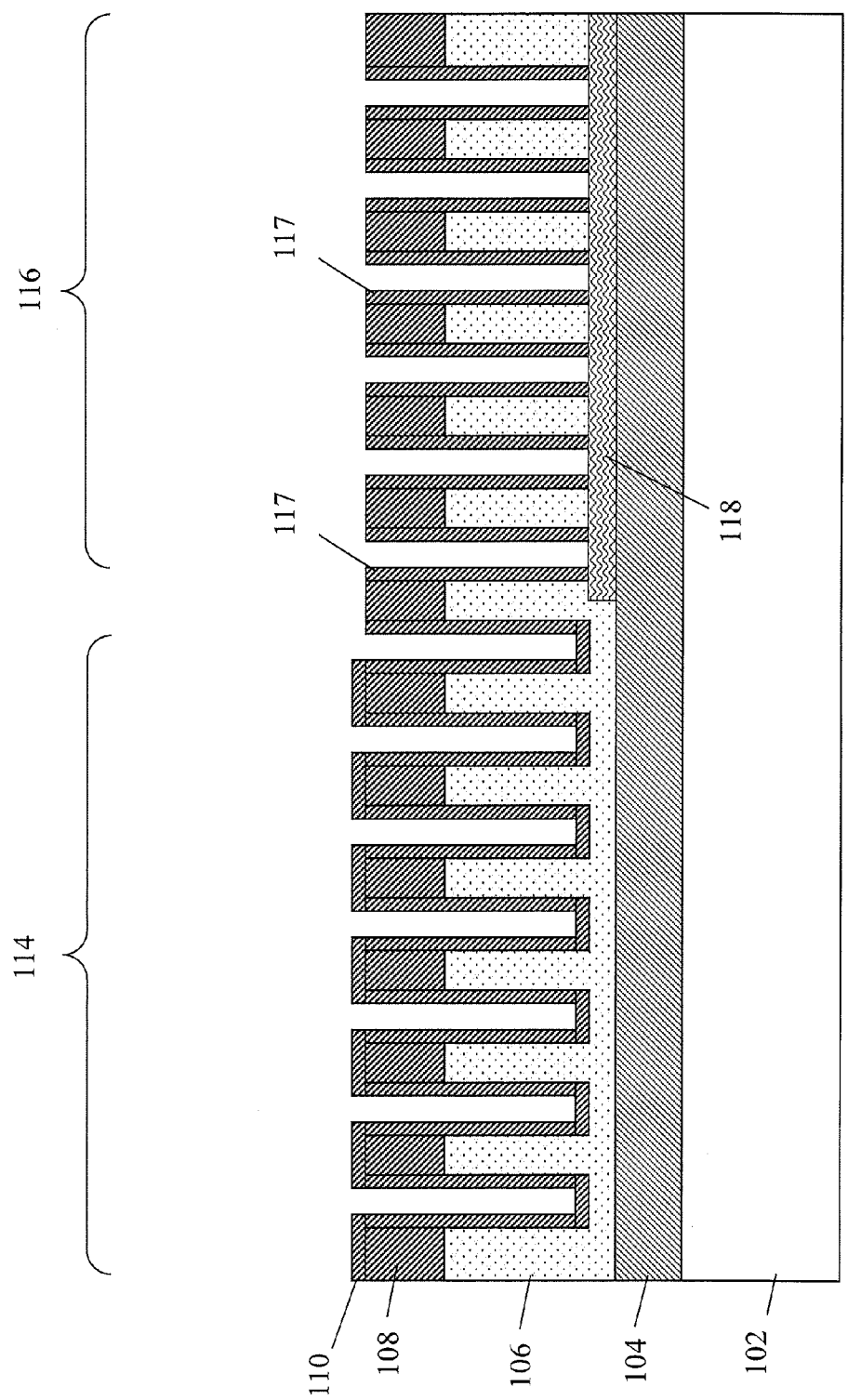

Proceeding to FIG. 10, an oxidation process is performed so as to convert the exposed bottom surface of the partially etched strained silicon layer 106 to an oxide material layer 118, thereby relaxing the tensile strain in the partially etched silicon fins in the PFET region 116. The oxidation process is characterized by a viscous flow and may be performed, for example, by first depositing a chemical vapor deposition (CVD) of a flowable oxide and next planarizing the deposited oxide to the top of the hardmask, in combination with application of furnace heating at a temperature in a range of about 900° C. to about 1000° C. in an oxygen environment which oxidizes the silicon in the desired regions not covered by the dielectric spacer layer 110. The deposited oxide acts to stabilize the structure so the fins do not distort or collapse. Alternatively, the furnace heating may be applied in the absence of a deposited CVD oxide to convert the exposed strained silicon layer 106 to the oxide material layer 118. As the remaining regions of the strained silicon layer 106 are protected by nitride materials, those portions do not become oxidized. Thus, the heating process does not affect the tensile strain in the NFET region 114.

Figure 11:
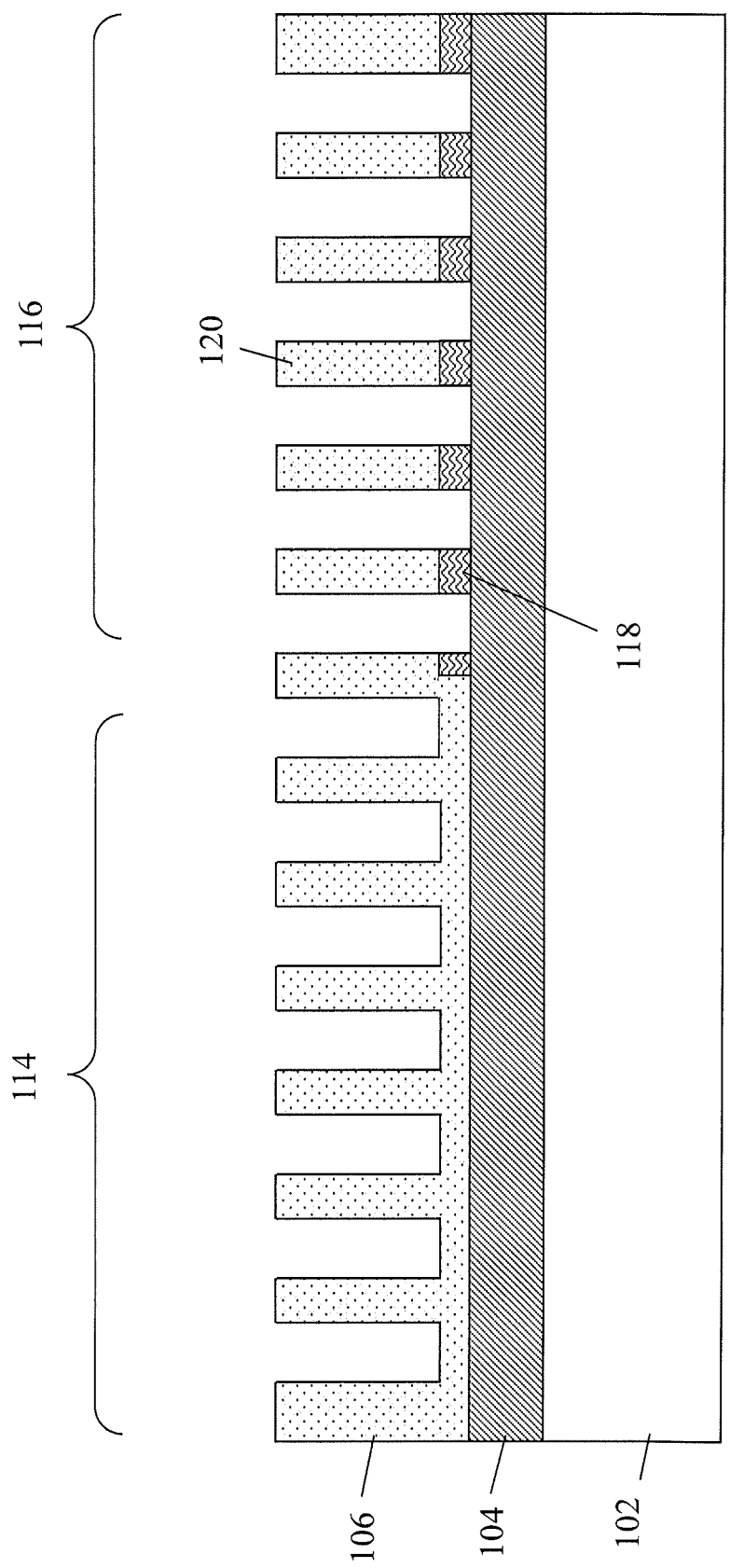
Figure 12:
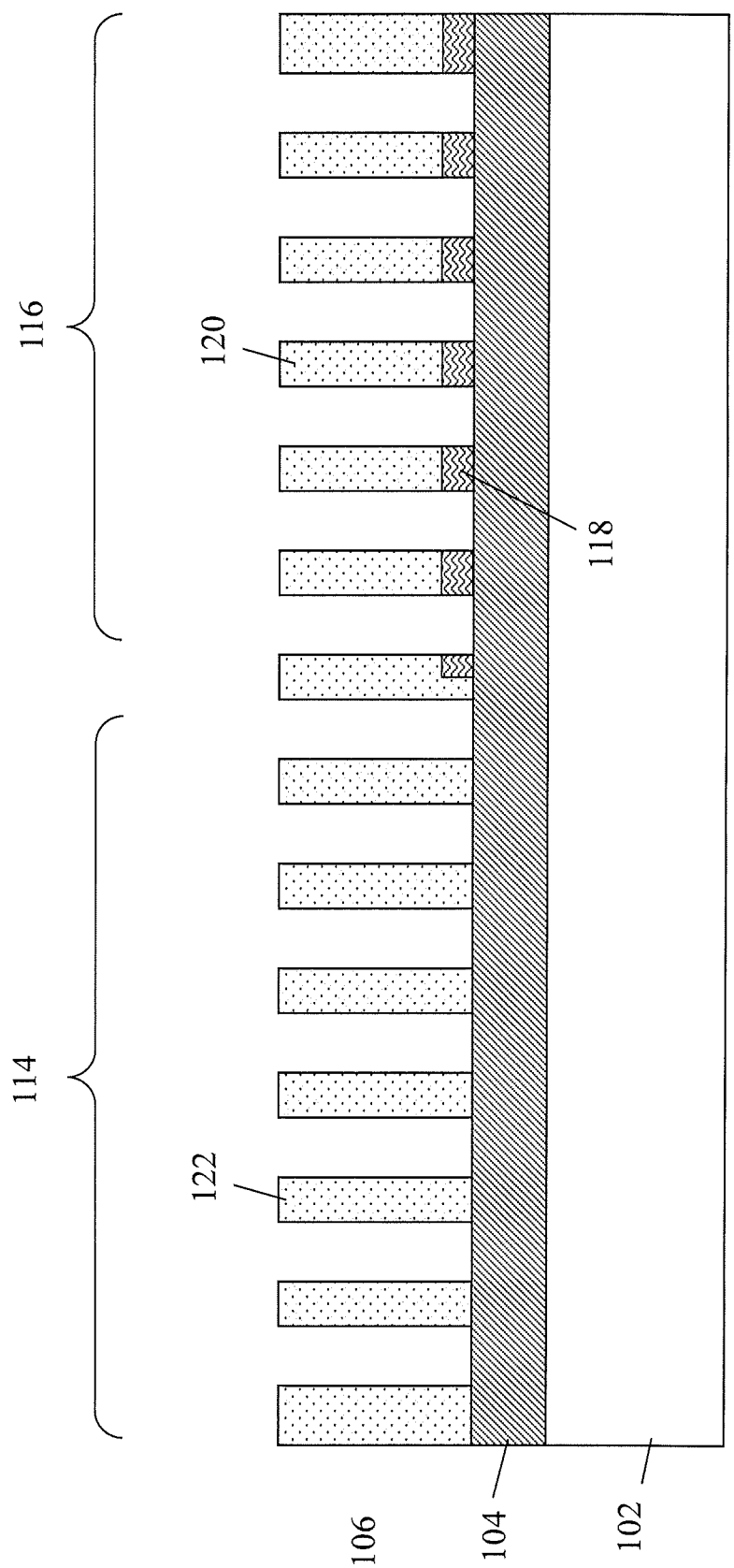
FIG. 12 illustrates a second fin etch to fully define the tensile strained NFET fins, stopping on the BOX layer.

Following the formation of the flowed oxide layer 118, any residual CVD oxide material may be removed, such as by a dilute hydrofluoric acid (DHF) etch, as shown in FIG. 11. The oxide removal may also result in etching away of at least a portion of the oxide material layer 118 not directly under the relaxed silicon PFET fins 120. Then as further shown in FIG. 11, a nitride removal process is used to remove remaining portions of the dielectric spacer layer 110/sidewall spacers 117, and original hardmask layer 108. A second fin etch is then performed to fully define the tensile strained NFET fins 122, stopping on the BOX layer 104 as shown in FIG. 12. From this point, additional processing may continue as known in the art. This may also include, for example, forming compressively strained SiGe channel regions for the relaxed PFET fins 120 at a later stage in FET processing. Here, a SiGe layer would be epitaxially grown on exposed channel regions of the PFET fins, followed by an oxidation that causes Ge atoms in the SiGe layer to diffuse into the silicon fins to form compressively strained SiGe, while outer portions of the original epitaxial SiGe layer are converted to silicon oxide.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A CMOS structure, comprising:
a semiconductor substrate;
a plurality of NFET fins formed on the substrate, the plurality of NFET fins comprising a tensile strained silicon material; and
a plurality of PFET fins formed on the substrate, the plurality of PFET fins comprising relaxed silicon material;
wherein bottom portions of the PFET fins comprise oxidized portions of the initially tensile strained silicon material such that the oxidized portions cause relaxation of the initially tensile strained silicon material.

2. The structure of claim 1, wherein the NFET fins are formed on an insulator layer of the substrate.

3. The structure of claim 2, wherein oxidized portions bottom portions of the PFET fins are formed on the insulator layer of the substrate.

* * * * *